US009318592B2

(12) United States Patent
Briere

(10) Patent No.: US 9,318,592 B2
(45) Date of Patent: Apr. 19, 2016

(54) ACTIVE AREA SHAPING OF III-NITRIDE DEVICES UTILIZING A SOURCE-SIDE FIELD PLATE AND A WIDER DRAIN-SIDE FIELD PLATE

(71) Applicant: International Rectifier Corporation, El Segundo, CA (US)

(72) Inventor: Michael A. Briere, Scottsdale, AZ (US)

(73) Assignee: Infineon Technologies Americas Corp., El Segundo, CA (US)

(*) Notice: Subject to any disclaimer, the term of this patent is extended or adjusted under 35 U.S.C. 154(b) by 0 days.

(21) Appl. No.: 14/081,982

(22) Filed: Nov. 15, 2013

(65) Prior Publication Data

US 2014/0070279 A1 Mar. 13, 2014

Related U.S. Application Data

(63) Continuation-in-part of application No. 13/965,421, filed on Aug. 13, 2013, which is a continuation of application No. 13/721,573, filed on Dec. 20, 2012, now Pat. No. 8,536,624, which is a continuation of application No. 12/008,190, filed on Jan. 9, 2008, now Pat. No. 8,338,861.

(60) Provisional application No. 60/884,272, filed on Jan. 10, 2007.

(51) Int. Cl.

| | |
|---|---|
| ***H01L 29/778*** | (2006.01) |
| ***H01L 21/28*** | (2006.01) |
| ***H01L 29/423*** | (2006.01) |
| ***H01L 29/66*** | (2006.01) |
| *H01L 29/20* | (2006.01) |
| *H01L 23/29* | (2006.01) |
| *H01L 29/40* | (2006.01) |
| *H01L 29/51* | (2006.01) |
| *H01L 23/31* | (2006.01) |

(52) U.S. Cl.

CPC ........ *H01L 29/778* (2013.01); *H01L 21/28264* (2013.01); *H01L 29/42376* (2013.01); *H01L 29/66462* (2013.01); *H01L 29/7786* (2013.01); *H01L 23/291* (2013.01); *H01L 23/3171* (2013.01); *H01L 29/2003* (2013.01); *H01L 29/402* (2013.01); *H01L 29/518* (2013.01); *H01L 2924/0002* (2013.01)

(58) Field of Classification Search

CPC ............................ H01L 29/778; H01L 29/404

USPC ................................................. 257/194, 488

See application file for complete search history.

(56) References Cited

U.S. PATENT DOCUMENTS

| | | | | |
|---|---|---|---|---|
| 7,075,125 | B2 | 7/2006 | Saito | |
| 8,049,252 | B2 | 11/2011 | Smith | |
| 8,524,601 | B2 * | 9/2013 | Kurahashi et al. | 438/674 |
| 2006/0202272 | A1 * | 9/2006 | Wu et al. | 257/355 |

(Continued)

*Primary Examiner* — Mark Prenty

(74) *Attorney, Agent, or Firm* — Farjami & Farjami LLP

(57) ABSTRACT

In an exemplary implementation, a III-nitride semiconductor device includes a III-nitride heterojunction including a first III-nitride body situated over a second III-nitride body to form a two-dimensional electron gas. The III-nitride semiconductor device further includes a gate well formed in a dielectric body, the dielectric body situated over the III-nitride heterojunction. A gate arrangement is situated in the gate well and includes a gate electrode, a source-side field plate, and a drain-side field plate. The source-side field plate and the drain-side field plate each include steps, and the drain-side field plate is wider than the source-side field plate.

16 Claims, 9 Drawing Sheets

(56) References Cited

U.S. PATENT DOCUMENTS

2007/0018199 A1* 1/2007 Sheppard et al. ............. 257/200
2009/0189187 A1* 7/2009 Briere et al. .................. 257/192
2011/0057257 A1 3/2011 Park
2012/0223319 A1* 9/2012 Dora ............................... 257/76
2012/0267687 A1 10/2012 Jeon
2014/0077266 A1 3/2014 Ramdani

* cited by examiner

ACTIVE AREA SHAPING OF III-NITRIDE DEVICES UTILIZING A SOURCE-SIDE FIELD PLATE AND A WIDER DRAIN-SIDE FIELD PLATE

The present application is a continuation-in-part of U.S. patent application Ser. No. 13/965,421, filed on Aug. 13, 2013, which itself is a continuation of U.S. patent application Ser. No. 13/721,573, filed on Dec. 20, 2012, which in turn is a continuation of U.S. patent application Ser. No. 12/008,190, filed on Jan. 9, 2008, which claims priority to U.S. provisional application 60/884,272, filed on Jan. 10, 2007. The present application claims the benefit of and priority to all of the above-identified applications; and the disclosures of all of the above-identified applications are hereby fully incorporated by reference into the present application.

BACKGROUND

I. Definitions

As used herein, the phrase "group III-V" refers to a compound semiconductor including at least one group III element and at least one group V element. By way of example, a group III-V semiconductor may take the form of a III-Nitride semiconductor. "III-Nitride", or "III-N", refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium.

II. Background Art

A III-nitride heterojunction semiconductor device can include a III-nitride heterojunction having a first III-nitride body of one bandgap and a second III-nitride body of another bandgap formed over the first III-nitride body. The composition of the first and second III-nitride bodies are selected to cause the formation of a carrier rich region referred to as a two-dimensional electron gas (2DEG) at or near the III-nitride heterojunction. The 2DEG can serve as a conduction channel between a first power electrode (e.g. a source electrode) and a second power electrode (e.g. a drain electrode).

The III-nitride heterojunction semiconductor device can also include a gate electrode disposed between the first and second power electrodes to selectively interrupt or restore the 2DEG therebetween, whereby the device may be operated as a switch. The gate electrode may be received by a trench that extends through a passivation body. The trench in which the gate electrode is received includes vertical sidewalls that form sharp bottom corners in the gate electrode. This can result in high electric field regions at the bottom corners of the gate electrode, as well as an increase in the overlap between the gate electrode and the 2DEG.

SUMMARY

Active area shaping of III-nitride devices utilizing a source-side field plate and a wider drain-side field plate, substantially as shown in and/or described in connection with at least one of the figures, and as set forth more completely in the claims.

DETAILED DESCRIPTION

Figure 1A:
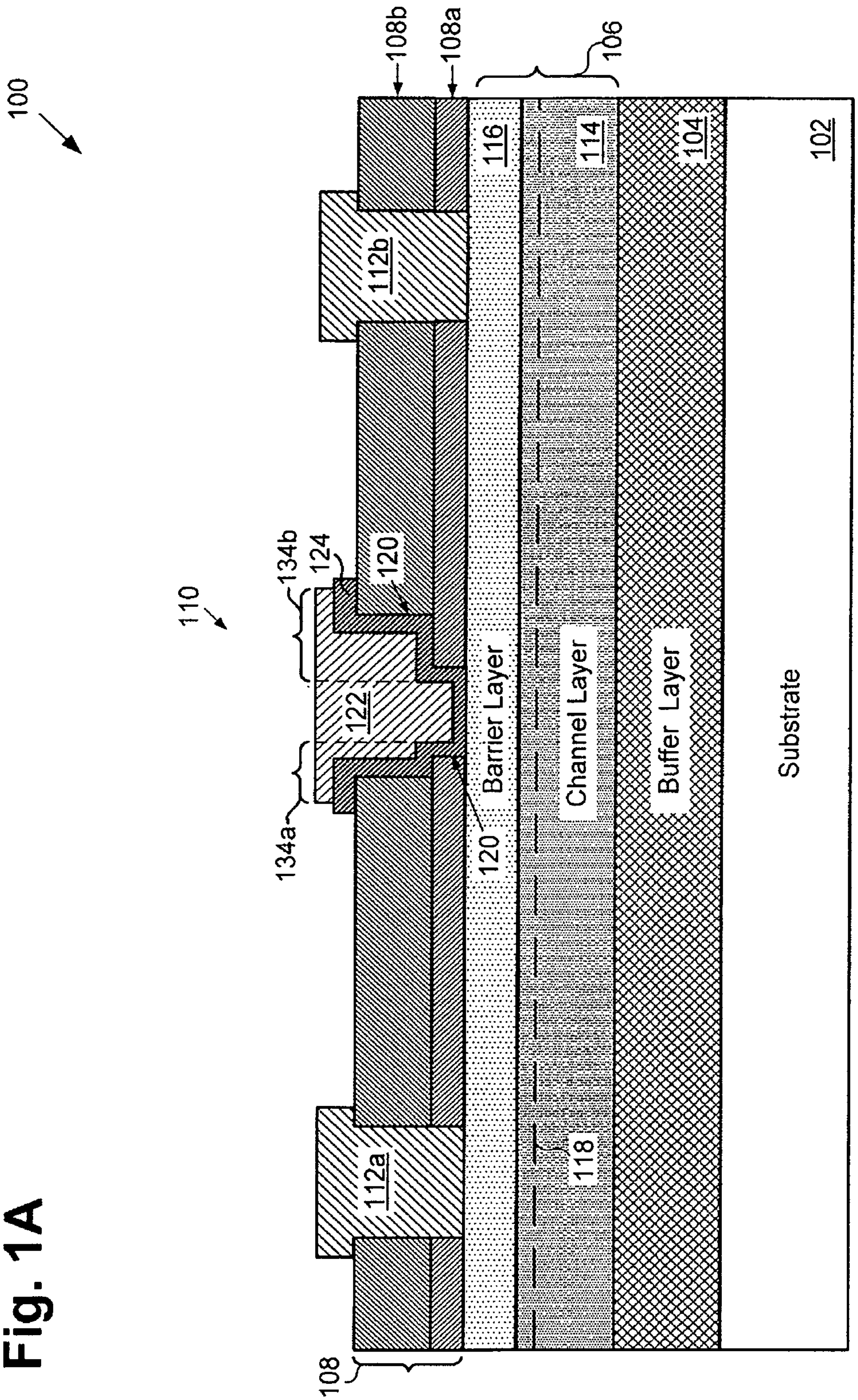
FIG. 1A presents a cross-sectional view of a portion of an exemplary III-nitride semiconductor device, in accordance with one implementation of the present disclosure.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1A presents a cross-sectional view of a portion of an exemplary III-nitride semiconductor device, in accordance with one implementation of the present disclosure. In FIG. 1A, III-nitride semiconductor device 100 is a transistor (e.g. a high-electron-mobility transistor), and may be an enhancement mode or depletion mode transistor. III-nitride semiconductor device 100 includes substrate 102, buffer layer 104, III-nitride heterojunction 106, dielectric body 108, gate arrangement 110, and ohmic electrodes 112*a* and 112*b*.

In the present implementation, buffer layer 104 includes AlN, by way of example, and is formed over substrate 102. Substrate 102 is a silicon substrate in the present implementation, however other substrate materials can be utilized. III-nitride semiconductor device 100 can include other layers not specifically shown in FIG. 1A, such as transition layers configured to manage stress between substrate 102 and III-nitride body 114. Other examples include spacer layers and cap layers.

III-nitride heterojunction 106 is formed over buffer layer 104 and includes III-nitride body 116 situated over III-nitride body 114 to form a two-dimensional electron gas (2DEG) 118. III-nitride body 114 may also be referred to as a channel layer and III-nitride body 116 may also be referred to as a barrier layer, as shown in FIG. 1A. The composition of III-nitride bodies 114 and 116 are selected to cause formation 2DEG 118, which is rich in carriers and forms a conduction channel between ohmic electrodes 112*a* and 112*b*. III-nitride body 114 includes semiconductor material of one bandgap, and III-nitride body 116 includes semiconductor material of another bandgap. In the present implementation, III-nitride body 114 includes GaN and III-nitride body 116 includes AlGaN. However, other semiconductor materials may be utilized, such as other group III-V semiconductor materials (e.g. III-Nitride materials).

Also in FIG. 1A, ohmic electrodes 112*a* and 112*b* are ohmically coupled to III-nitride body 116 and are thereby electrically coupled to 2DEG 118. Ohmic electrodes 112*a* and 112*b* extend through dielectric body 108 to contact III-nitride body 116. As shown, ohmic electrodes 112*a* and 112*b* are optionally situated in respective trenches in dielectric body 108. In III-nitride semiconductor device 100, ohmic electrode 112*a* is a source electrode and ohmic electrode 112*b* is a drain electrode.

Also in the present implementation, dielectric body 108 is situated over III-nitride heterojunction 106 and includes dielectric layer 108*a* of a first dielectric material and dielectric layer 108*b* of a second dielectric material different than the first dielectric material. Dielectric body 108 is configured to passivate III-nitride body 116. As such, dielectric body 108 can be referred to as a passivation body in some implementations. In one implementation, dielectric layer 108*a* is an oxide and dielectric layer 108*b* is a nitride. In another implementation, dielectric layer 108*a* is a nitride and dielectric layer 108*b* is an oxide. Silicon Oxide ($SiO_2$) is an example of a material suitable for the oxide and silicon nitride ($Si_xN_y$) is an example of a material suitable for the nitride. Although not shown in FIG. 1A, dielectric body 108 can include one or more additional dielectric layers. The one or more additional dielectric layers can be of a third dielectric material different than the first or second dielectric materials. However, in one implementation, an additional dielectric layer is situated over dielectric layer 108*b* and is of the first dielectric material. In some implementations, dielectric body 108 alternates between dielectric layers of the first and second dielectric materials.

Figure 1B:
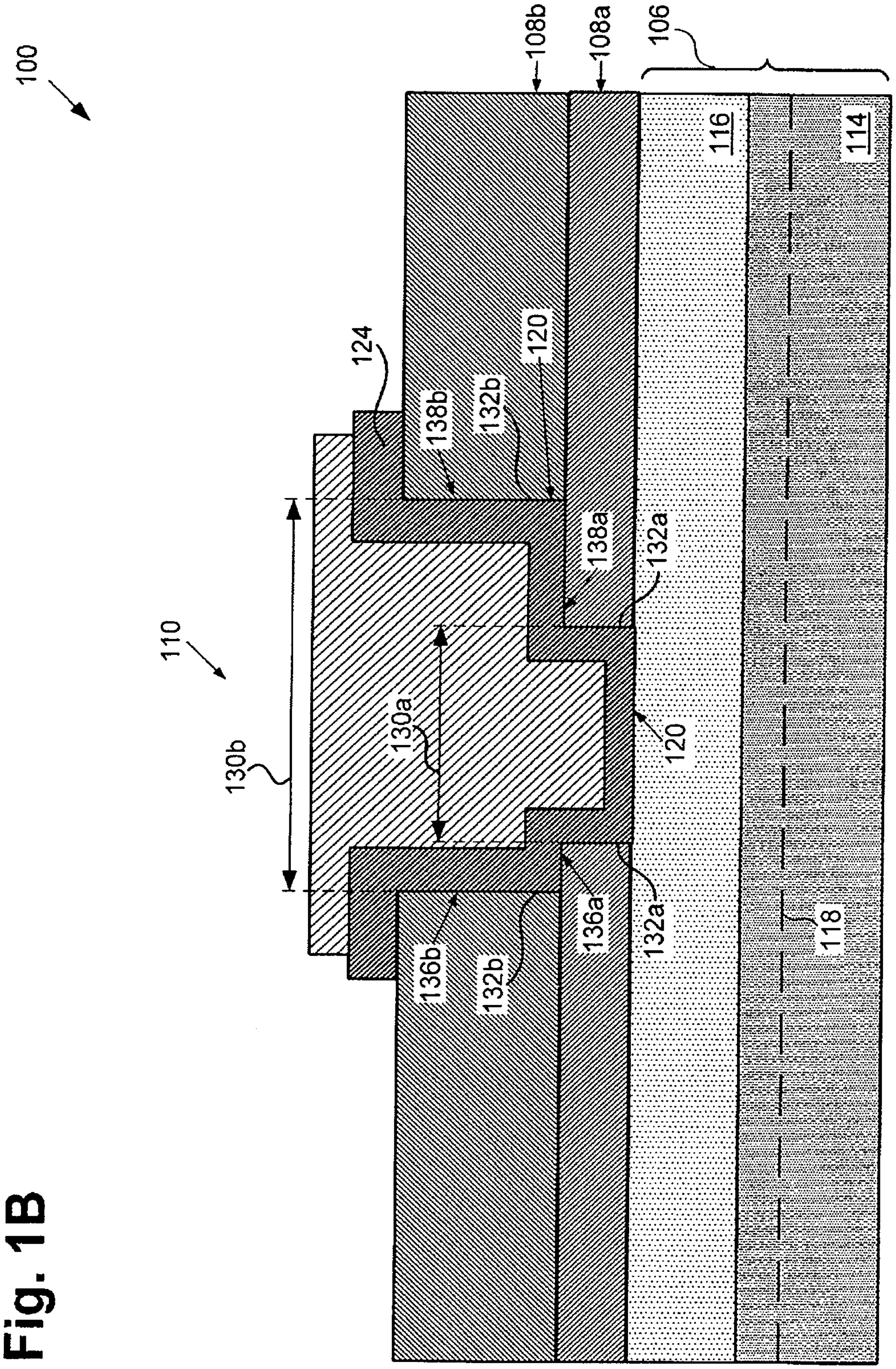
FIG. 1B presents an enhanced cross-sectional view of a portion of an exemplary III-nitride semiconductor device, in accordance with one implementation of the present disclosure.

Gate well 120 is defined by dielectric body 108 and extends through dielectric body 108 to contact III-nitride layer 116. As shown, gate well 120 is formed in dielectric body 108 and is defined by dielectric layers 108*a* and 108*b* of dielectric body 108. Referring now to FIG. 1B, FIG. 1B presents an enhanced cross-sectional view of the portion of the exemplary III-nitride semiconductor device shown in FIG. 1A. FIG. 1B shows gate well 120 being of width 130*a* defined by dielectric layer 108*a*, and being of width 130*b* defined by dielectric layer 108*b*.

As shown in FIG. 1B, width 130*a* is defined by opening 132*a* in dielectric layer 108*a*. Furthermore, width 130*b* is defined by opening 132*b* in dielectric layer 108*b*. It is noted that in some implementations, dielectric body 108 can be a single dielectric layer and openings opening 132*a* and 132*b* can be in the single layer. Furthermore, dielectric body 108 may include additional dielectric layers, such that any of openings 132*a* and 132*b* can be in multiple dielectric layers.

In the present implementation, ledges 136*a* and 138*a* of dielectric layer 108*a* define width 130*a* of gate well 120 as well as opening 132*a*. Also, sidewalls 136*b* and 138*b* of dielectric layer 108*b* define width 130*b* of gate well 120 as well as opening 132*b*. Width 130*b* is greater than width 130*a*, such that gate well 120 expands in width away from III-nitride heterojunction 106. Thus, opening 132*b* in dielectric layer 108*b* is wider than opening 132*a* in dielectric layer 108*a*.

Gate arrangement 110 includes gate electrode 122 situated in gate well 120. Gate electrode 122 is disposed between ohmic electrodes 112*a* and 112*b* and is configured to selectively modulate 2DEG 118, whereby III-nitride semiconductor device 100 may be operated as a switch. Gate electrode 122 can make Schottky contact with III-nitride heterojunction 106. However, in the present implementation, gate arrangement 110 includes gate dielectric 124, such that gate electrode 122 makes capacitive contact with III-nitride heterojunction 106. Gate dielectric 124 is situated in and lines gate well 120. Suitable materials for gate dielectric 124 include silicon nitride ($Si_xN_y$) and/or other suitable gate dielectric material or materials.

In gate arrangement 110, gate electrode 122 is integrated with at least one field plate. For example, FIG. 1A shows gate electrode 122 as being integrated with field plates 134*a* and 134*b*. Field plates 134*a* and 134*b* are situated over dielectric layer 108*a*. Gate dielectric 124 and/or any of field plates 134*a* and 134*b* can optionally extend out from gate well 120, as shown in FIGS. 1A and 1B. Thus, as shown, field plates 134*a* and 134*b* are also situated over dielectric layer 108*b*. Also, a side of gate well 120 without a corresponding field plate may be substantially parallel to an adjacent side of gate electrode 122, as no ledge is required.

Field plate 134*a* is situated between gate electrode 122 and ohmic electrode 112*a*, which is a source electrode. Thus, field plate 134*a* may be referred to as a source-side field plate. Field plate 134*b* is situated between gate electrode 122 and ohmic electrode 112*b*, which is a drain electrode. Thus, field plate 134*b* may be referred to as a drain-side field plate. It is noted that various implementations may include only one of field plates 134*a* and 134*b*.

Gate electrode 122 is situated in opening 132*a* in dielectric layer 108*a*, and field plates 134*a* and 134*b* are situated in opening 132*b* in dielectric layer 108*b*. In the implementation shown, gate arrangement 110 fills opening 132*a* in dielectric layer 108*a* and opening 132*b* in dielectric layer 108*b*. More particularly, gate electrode 122, field plates 134*a* and 134*b*, and optionally gate dielectric 124 collectively fill gate well 120. By integrating field plates 134*a* and 134*b* with gate electrode 122, overlap between gate electrode 122 and 2DEG 118 can be decreased thereby reducing gate-drain charge (Qgd) for III-nitride semiconductor device 100. Furthermore, field plates 134*a* and 134*b* alleviate high electric fields that would otherwise form from sharp corners of gate electrode 122, thereby increasing breakdown voltage of III-nitride semiconductor device 100.

In some implementations, one of the ledges, for example, ledge 138*a* that is closer to ohmic electrode 112*b* (e.g. a drain electrode) may be wider than ledge 136*a*, which is closer to ohmic electrode 112*a* (e.g. a source electrode). The width of each ledge is in the lateral dimension inside gate well 120. Doing so can further improve breakdown voltage of III-nitride semiconductor device 100. Ledge 138*a* can be between approximately 2 to approximately 4 times as wide as ledge 136*a*, by way of example. In the implementation shown, ledge 136*a* is approximately 0.025 μm wide and ledge 138*a* is between approximately 0.05 μm to 0.1 μm wide. As a result, field plate 134*b* may be wider than field plate 134*a*, as shown. The portion of field plate 134*b* over only dielectric layer 108*a* of dielectric body 108 is wider than the portion of field plate 134*a* over only dielectric layer 108*a* of dielectric body 108. However, the portion of field plate 134*b* over both dielectric layers 108*a* and 108*b* can also be wider than the portion of field plate 134*a* over both dielectric layers 108*a* and 108*b*.

Figure 2:
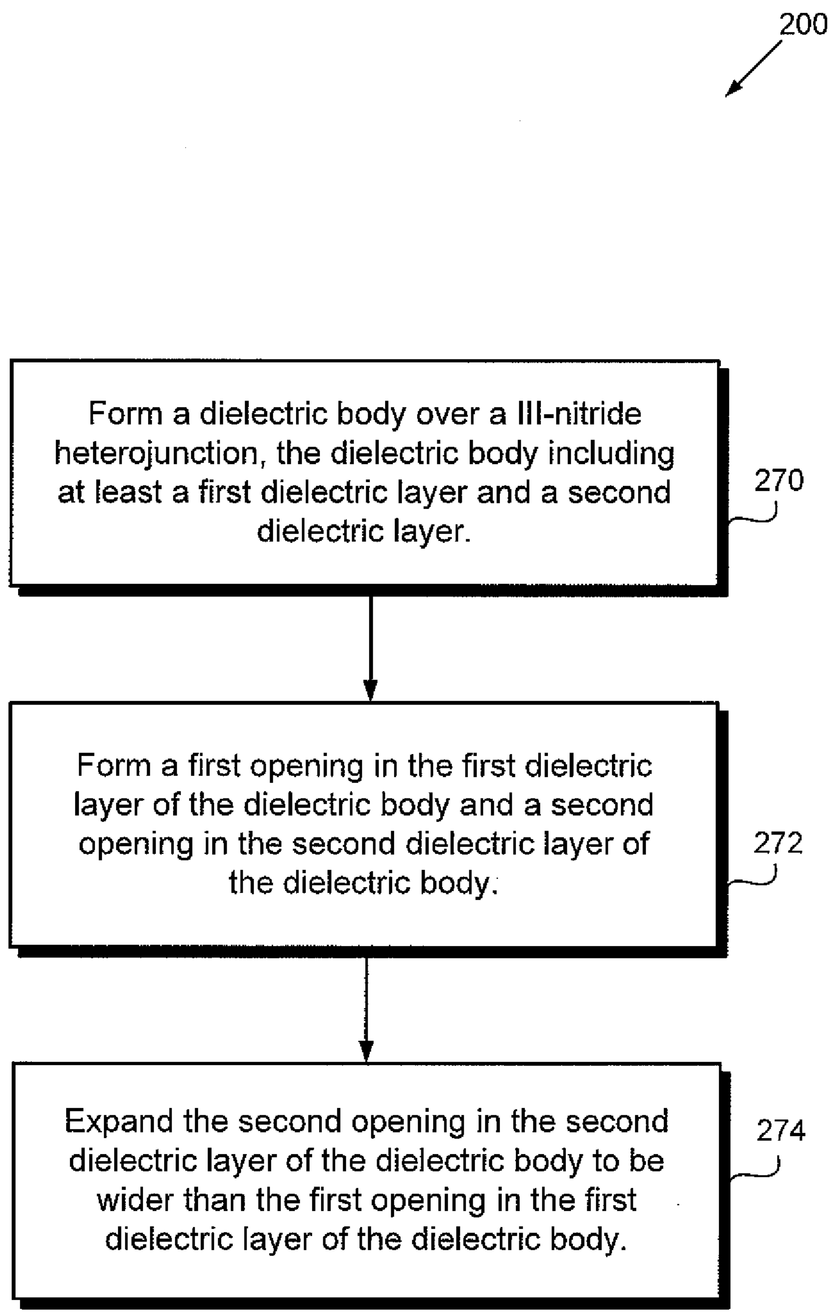
FIG. 2 shows a flowchart illustrating an exemplary method for fabricating a III-nitride semiconductor device, in accordance with one implementation of the present disclosure.

FIG. 2 shows a flowchart illustrating an exemplary method for fabricating a III-nitride semiconductor device, in accordance with one implementation of the present disclosure. The approach and technique indicated by flowchart 200 are sufficient to describe at least one implementation of the present disclosure, however, other implementations of the disclosure may utilize approaches and techniques different from those shown in flowchart 200. Furthermore, while flowchart 200 is described with respect to FIGS. 3A, 3B, and 3C, disclosed inventive concepts are not intended to be limited by specific features shown and described with respect to FIGS. 3A, 3B, and 3C. Furthermore, with respect to the method illustrated in FIG. 2, it is noted that certain details and features have been left out of flowchart 200 in order not to obscure discussion of inventive features in the present application. Furthermore, implementations illustrated by flowchart 200 are performed on a processed wafer, which, includes, amongst other things, a substrate, a III-nitride heterojunction, and a buffer layer, and or other features, such as transition layers and/or spacer layers. The wafer may also be referred to as a semiconductor die or simply a die in the present application.

Figure 3A:
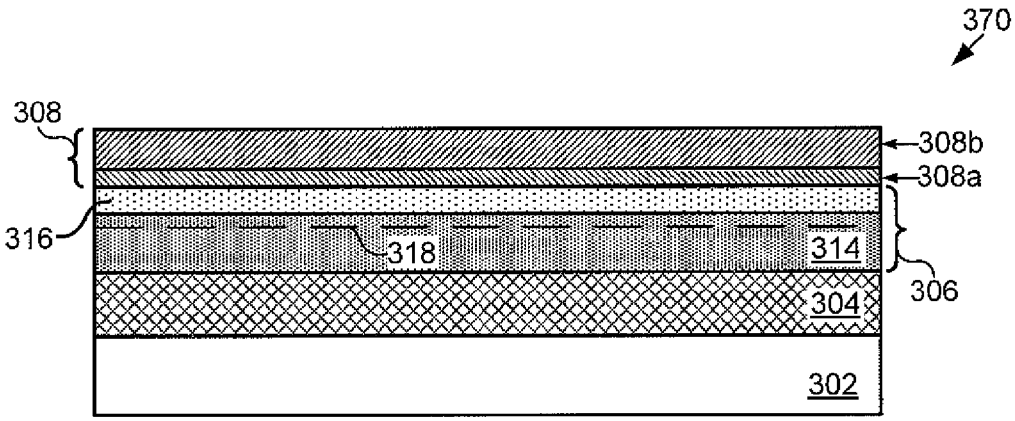
FIG. 3A illustrates a cross-sectional view, which includes a portion of an exemplary wafer processed according to an implementation disclosed in the present application.

Referring now to flowchart 200 of FIG. 2 and FIG. 3A, flowchart 200 includes forming a dielectric body over a III-nitride heterojunction, the dielectric body including at least a first dielectric layer and a second dielectric layer (270 in FIG. 2). As shown in FIG. 3A, structure 370 includes substrate 302, buffer layer 304, III-nitride heterojunction 306, and dielectric body 308 corresponding respectively to substrate 102, buffer layer 104, III-nitride heterojunction 106, and dielectric body 108 in FIGS. 1A and 1B during fabrication of III-nitride semiconductor device 100. III-nitride heterojunction 306 includes III-nitride bodies 314 and 316 corresponding respectively to III-nitride bodies 114 and 116 in FIGS. 1A and 1B during fabrication of III-nitride semiconductor device 100.

In forming structure 370, buffer layer 304, such as AlN, can be grown over substrate 302 such as a silicon substrate, a silicon carbide substrate, a sapphire substrate, or the like. Buffer layer 304 may not be necessary if substrate 302 is compatible with III-nitride body 314. As one example, buffer layer 304 may not be necessary if substrate 302 is a GaN substrate. After buffer layer 304 is formed, III-nitride body 314, for example, GaN, can be grown over buffer layer 304, followed by growth of III-nitride body 316, for example, AlGaN, to obtain 2DEG 318, corresponding to 2DEG 118 in FIGS. 1A and 1B.

Thereafter, dielectric body 308 is formed over III-nitride heterojunction 306, buffer layer 304, and substrate 302. Dielectric body 308 includes at least dielectric layer 308*a* and dielectric layer 308*b* corresponding respectively to dielectric layer 108*a* and dielectric layer 108*b* in FIGS. 1A and 1B during fabrication of III-nitride semiconductor device 100. Forming dielectric body 308 can include growing or depositing dielectric layer 308*a* of a first dielectric material over III-nitride heterojunction 306 and growing or depositing dielectric layer 308*b* of a second dielectric material over dielectric layer 308*a*.

The first and second dielectric materials can optionally be different dielectric materials, such as in the present implementation. For example, the first and second dielectric materials can be selected such that an enchant capable of removing portions of dielectric layer 308*b* does not remove portions of dielectric layer 308*a* (i.e. the enchant is selective to dielectric layer 308*b*). Examples of suitable materials for dielectric layer 308*a* include field dielectrics, such as AlN and $Si_XN_Y$. Dielectric layer 308*a* can be approximately 0.05 μm to approximately 0.1 μm thick, by way of example.

Figure 3B:
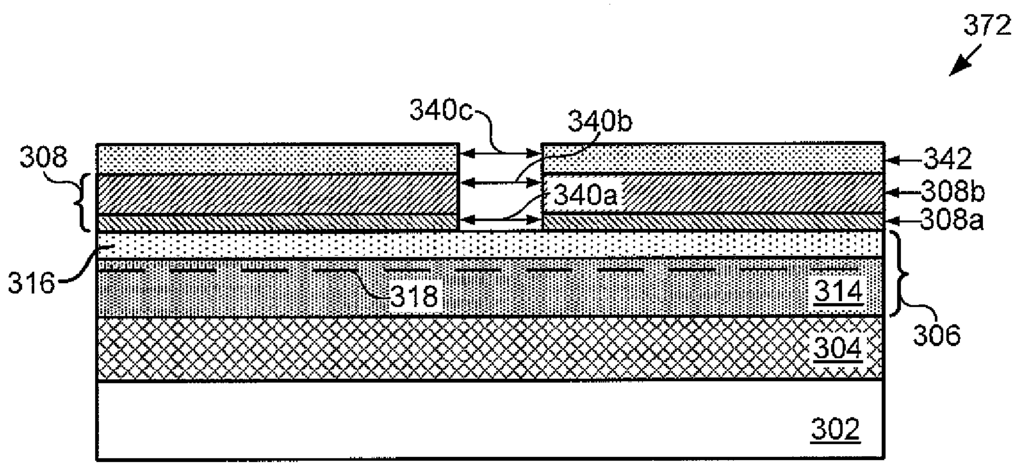
FIG. 3B illustrates a cross-sectional view, which includes a portion of an exemplary wafer processed according to an implementation disclosed in the present application.

Referring now to flowchart 200 of FIG. 2 and FIG. 3B, flowchart 200 includes forming a first opening in the first dielectric layer of the dielectric body and a second opening in the second dielectric layer of the dielectric body (272 in FIG. 2). As shown in FIG. 3B, structure 372 includes opening 340*a* in dielectric layer 308*a* and opening 340*b* in dielectric layer 308*b*.

In forming structure 372, mask 342 (e.g. a photoresist mask) can be deposited over dielectric body 308 of structure 370. Mask 342 can be patterned (e.g. utilizing photolithography) to form opening 340*c* over dielectric body 308. Thereafter, openings 340*a* and 340*b* can be formed in dielectric layers 308*a* and 308*b* by etching through dielectric layers 308*a* and 308*b*. The etch is isotropic in some implementations. Thus, openings 340*a* and 340*b* may form substantially vertical sidewalls in dielectric body 308, as shown.

Figure 3C:
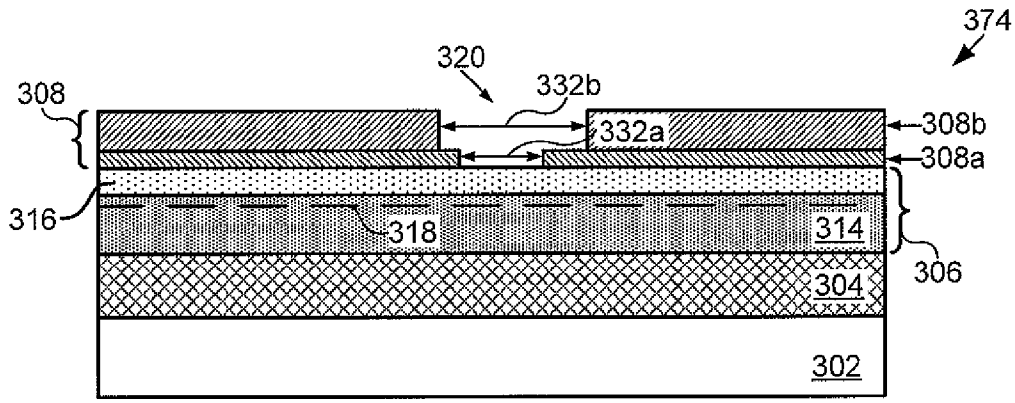
FIG. 3C illustrates a cross-sectional view, which includes a portion of an exemplary wafer processed according to an implementation disclosed in the present application.

Referring now to flowchart 200 of FIG. 2 and FIG. 3C, flowchart 200 includes expanding the second opening in the second dielectric layer of the dielectric body to be wider than the first opening in the first dielectric layer of the dielectric body (274 in FIG. 2). As shown in FIG. 3B, structure 374 opening 332*b* in dielectric layer 308*b* of dielectric body 308 is wider than and opening 332*a* in dielectric layer 308*a* of dielectric body 308.

In forming structure 374, mask 342 can be removed from structure 372, and a second mask and a second etch can be utilized to remove portions of dielectric layer 308*b* from the substantially vertical sidewalls formed in dielectric body 308. In doing so, gate well 320 can be formed corresponding to gate well 120 in FIGS. 1A and 1B. Thus, openings 332*a* and 332*b* can correspond respectively to openings 132*a* and 132*b* in FIGS. 1A and 1B. Subsequently, gate dielectric 124, gate electrode 122, and ohmic electrodes 112*a* and 112*b* may be formed so as to result in III-nitride semiconductor device 100 in FIGS. 1A and 1B. The second mask can be offset from the center opening 340*c* in mask 342 so that one of ledges 136*a* and 138*a* is wider than the other of ledges 136*a* and 138*a*.

As dielectric layer 308*a* includes a first dielectric material that is different than a second dielectric material of dielectric layer 308*b*, the second etch can be selective to dielectric layer 308*b*. As such, opening 340*a* of FIG. 3B can be substantially identical to opening 332*a* of FIG. 3C.

As an alternative, a single etch may be performed on structure 370 of FIG. 3A by utilizing an enchant, which etches dielectric layers 308*a* and 308*b* at different rates (i.e. etches dielectric layer 308*b* faster than dielectric layer 308*a*) to obtain structure 374 of FIG. 3C. As dielectric layer 308*a* includes a first dielectric material that is different than a second dielectric material of dielectric layer 308*b*, the single etch can occur at different rates on dielectric layers 308*a* and 308*b*. As such, the second mask and etch may be avoided. Thus, it will be appreciated that 272 and 274 in flowchart 200 of FIG. 2 can be concurrent, in some implementations. Such implementations may still include forming mask 342 of FIG. 3B with opening 340*c*, as described above.

Figure 4:
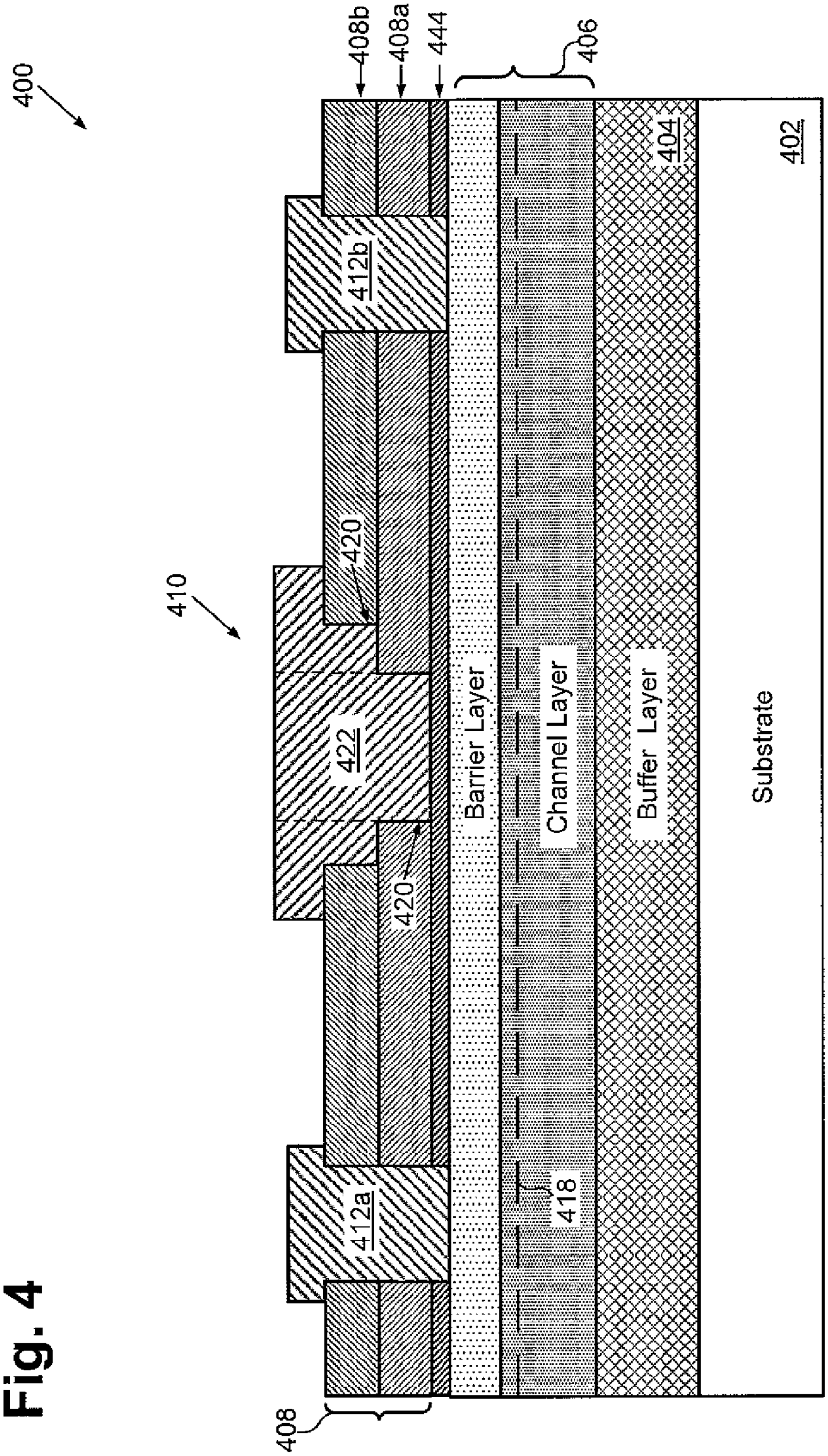
FIG. 4 presents a cross-sectional view of a portion of an exemplary III-nitride semiconductor device, in accordance with one implementation of the present disclosure.

While in implementations described above gate dielectric 124 is formed in gate well 120, in other implementations, gate well 120 is formed over gate dielectric 124. Referring now to FIG. 4, FIG. 4 presents a cross-sectional view of a portion of an exemplary III-nitride semiconductor device, in accordance with one implementation of the present disclosure.

In III-nitride semiconductor device 400, substrate 402, buffer layer 404, III-nitride heterojunction 406, dielectric body 408, ohmic electrodes 412*a* and 412*b*, gate well 420, and gate electrode 422 correspond respectively to buffer layer 104, III-nitride heterojunction 106, dielectric body 108, ohmic electrodes 112*a* and 112*b*, gate well 120, and gate electrode 122 in FIGS. 1A and 1B. Thus, III-nitride semiconductor device 400 can be similar to III-nitride semiconductor device 100 in FIGS. 1A and 1B. However, in gate arrangement 410 of III-nitride semiconductor device 400, gate dielectric 444 is situated below gate well 420. As one example, III-nitride semiconductor device 400 can be fabricated similar to III-nitride semiconductor device 100 by forming gate dielectric 444 over III-nitride heterojunction 406 prior to 270 in flowchart 200 of FIG. 2.

FIGS. 1A, 1B, 2, 3A, 3B, 3C, and 4 describe implementations in which a gate well is defined by two openings in a dielectric body. In doing so, a field plate can have a step defined in the dielectric body. However, the gate well can be defined by more than two openings in the dielectric body, an example of which is shown and described below with respect to FIGS. 5A and 5B. Doing so can provide for a field plate having additional steps defined by the dielectric body, which allows for enhanced active area shaping of a III-nitride semiconductor device.

Figure 5A:
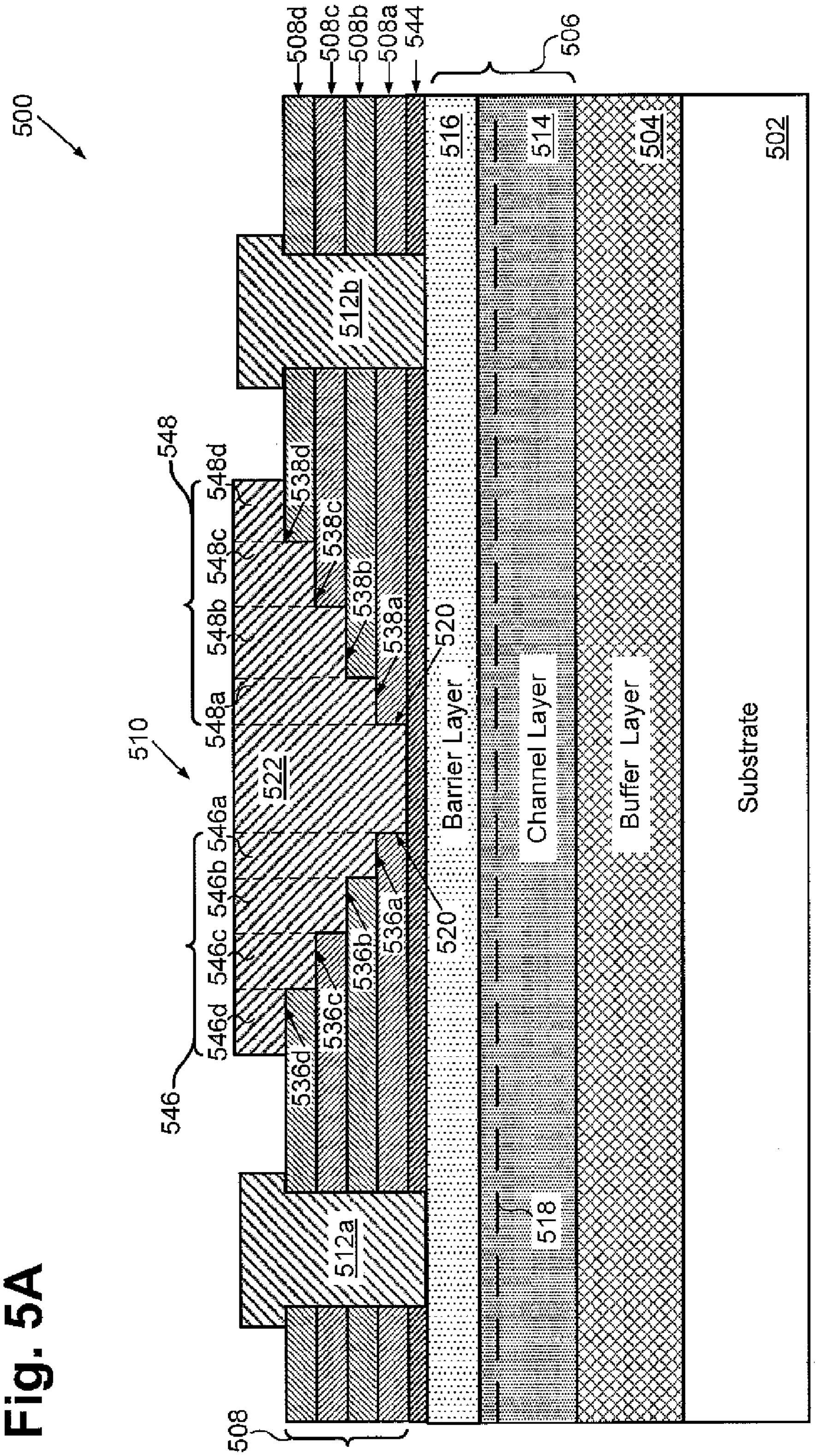
FIG. 5A presents a cross-sectional view of a portion of an exemplary III-nitride semiconductor device, in accordance with one implementation of the present disclosure.
Figure 5B:
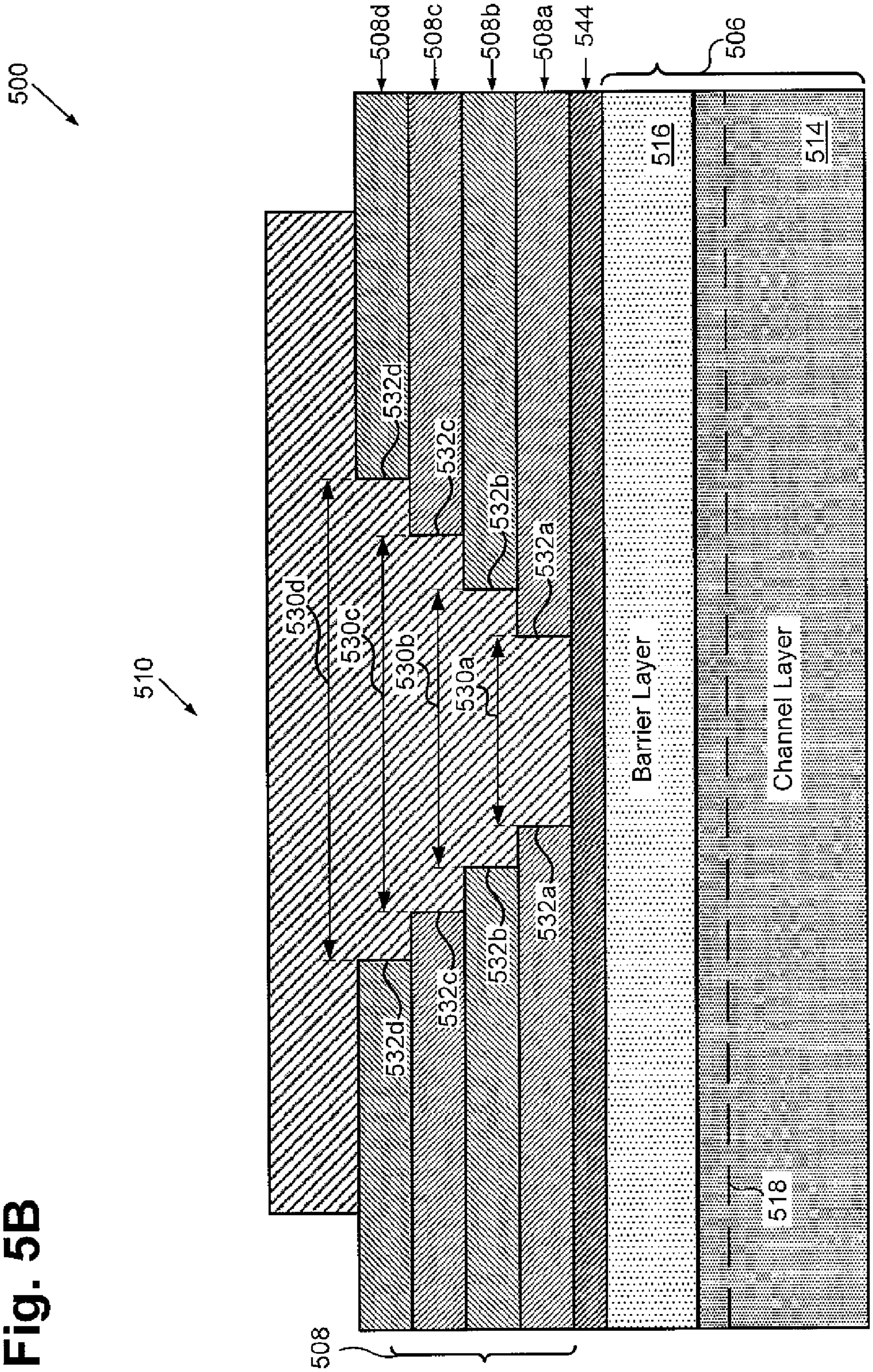
FIG. 5B presents an enhanced cross-sectional view of a portion of an exemplary III-nitride semiconductor device, in accordance with one implementation of the present disclosure.

FIG. 5A presents a cross-sectional view of a portion of an exemplary III-nitride semiconductor device, in accordance with one implementation of the present disclosure. FIG. 5B presents an enhanced cross-sectional view of the portion of the exemplary III-nitride semiconductor device of FIG. 5A. In FIGS. 5A and 5B, III-nitride semiconductor device 500 includes substrate 502, buffer layer 504, III-nitride heterojunction 506, dielectric body 508, gate arrangement 510, ohmic electrodes 512*a* and 512*b*, and gate well 520 corresponding respectively to substrate 102, buffer layer 104, III-nitride heterojunction 106, dielectric body 108, gate arrangement 110, ohmic electrodes 112*a* and 112*b*, and gate well 120 in FIGS. 1A and 1B.

III-nitride heterojunction 506 is formed over buffer layer 504 and includes III-nitride body 516 situated over III-nitride body 514 to form a two-dimensional electron gas (2DEG) 518. III-nitride bodies 514 and 516 and 2DEG 518 correspond respectively to III-nitride bodies 114 and 116 and 2DEG 118 in FIGS. 1A and 1B.

Gate arrangement 510 includes gate electrode 522 and field plates 546 and 548 corresponding respectively to gate electrode 122 and field plates 134*a* and 134*b* in FIGS. 1A and 1B. Thus, field plate 546 is a source-side field plate and field plate 548 is a drain-side field plate. Gate arrangement 510 also includes gate dielectric 544 corresponding to gate dielectric 444 in FIG. 4. While gate dielectric 544 is situated below gate well 520, similar to gate dielectric 444 in FIG. 4, in other implementations, gate dielectric 544 can be situated in and line gate well 520, similar to gate dielectric 124 in FIGS. 1A and 1B.

In III-nitride semiconductor device 500, dielectric body 508 includes dielectric layers 508*a*, 508*b*, 508*c*, and 508*d* (i.e. a plurality of dielectric layers). In other implementations, dielectric body 508 may include more or fewer dielectric layers. Dielectric layers 508*a* and 508*b* can correspond to dielectric layers 108*a* and 108*b* in dielectric body 108 of III-nitride semiconductor device 100. Thus, dielectric body 508 can include, for example, at least one silicon nitride layer and at least one silicon oxide layer. Dielectric layers 508*c* and 508*d* can be any suitable dielectric material, such as those described with respect to dielectric layers 108*a* and 108*b*.

In some implementations, dielectric layer 508*c* is of the same dielectric material as dielectric layer 508*a* and dielectric layer 508*d* is of the same dielectric material as dielectric layer 508*b*. In other implementations, dielectric layers 508*a*, 508*b*, 508*c*, and 508*d* are different dielectric materials from one another. Thus, in some implementations, gate well 520 may be formed utilizing an enchant, which etches any of dielectric layers 508*a*, 508*b*, 508*c*, and 508*d* at different rates from others of dielectric layers 508*a*, 508*b*, 508*c*, and 508*d*, such as has been described with respect to flowchart 200. However, one or more masks may be utilized to define the width of any of dielectric layers 508*a*, 508*b*, 508*c*, and 508*d* as well.

Referring to FIG. 5B, field plate 546 includes steps 546*a*, 546*b*, 546*c*, and 546*d* defined by dielectric body 508. Field plate 548 includes steps 548*a*, 548*b*, 548*c*, and 548*d* defined by dielectric body 508. By including field plates having at least two steps defined by a dielectric body, III-nitride semiconductor device 500 can achieve enhanced active area shaping including well-defined electric fields.

Referring to FIG. 5A with FIG. 5B, steps 546*a*, 546*b*, 546*c*, and 546*d* of field plate 546 are defined by openings 532*a*, 532*b*, 532*c*, and 532*d* in dielectric layers 508*a*, 508*b*, 508*c*, and 508*d*. Steps 548*a*, 548*b*, 548*c*, and 548*d* of field plate 548 are also defined by openings 532*a*, 532*b*, 532*c*, and 532*d* in dielectric layers 508*a*, 508*b*, 508*c*, and 508*d*. Each step may be defined by a respective opening in dielectric body 508, as shown. For example, step 546*a* is defined by opening 530*b*.

Steps 546*a*, 546*b*, 546*c*, and 546*d* of field plate 546 are respectively situated on ledges 536*a*, 536*b*, 536*c*, and 536*d* of dielectric body 508. Furthermore, steps 546*a*, 546*b*, 546*c*, and 546*d* of field plate 546 are defined by ledges 536*a*, 536*b*, 536*c*, and 536*d* of dielectric body 508. Similarly, steps 548*a*, 548*b*, 548*c*, and 548*d* of field plate 548 are respectively situated on ledges 538*a*, 538*b*, 538*c*, and 538*d* of dielectric body 508. Also, steps 548*a*, 548*b*, 548*c*, and 548*d* of field plate 548 are defined by ledges 538*a*, 538*b*, 538*c*, and 538*d* of dielectric body 508. Each step may be defined by a respective ledge of dielectric body 508, as shown. For example, step 548*a* is defined by ledge 536*b* of dielectric body 508. Although not shown in FIGS. 5A and 5B field plate 548 may be wider than field plate 546, similar to what is shown in FIGS. 1A and 1B. This may be accomplished where any of ledges 536*a*, 536*b*, 536*c*, and 536*d* are wider than any of ledges 538*a*, 538*b*, 538*c*, and 538*d*.

Gate well 520 is of width 530*a* defined by dielectric layer 508*a*, width 530*b* defined by dielectric layer 508*b*, width 530*c* defined by dielectric layer 508*c*, and width 530*d* defined by dielectric layer 508*d*. Width 530*b* is greater than width 530*a*, width 530*c* is greater than width 530*b*, and width 530*d* is greater than width 530*c*, such that gate well 520 expands in width away from III-nitride heterojunction 506. As gate arrangement 510 fills gate well 520, gate arrangement 510 also expands away from III-nitride heterojunction 506 so as to ease electric fields thereunder.

Figure 6A:
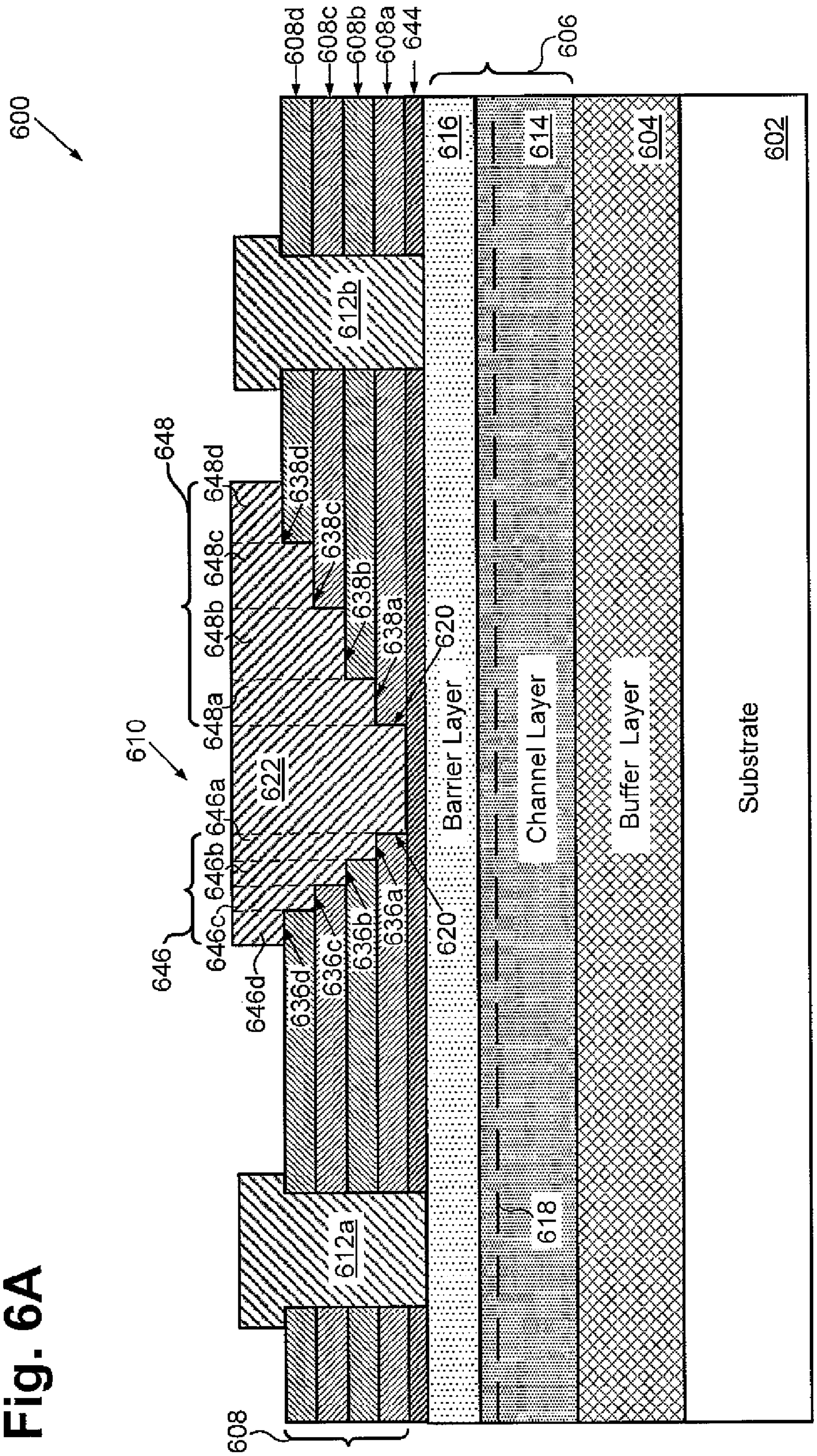
FIG. 6A presents a cross-sectional view of a portion of an exemplary III-nitride semiconductor device, in accordance with one implementation of the present disclosure.
Figure 6B:
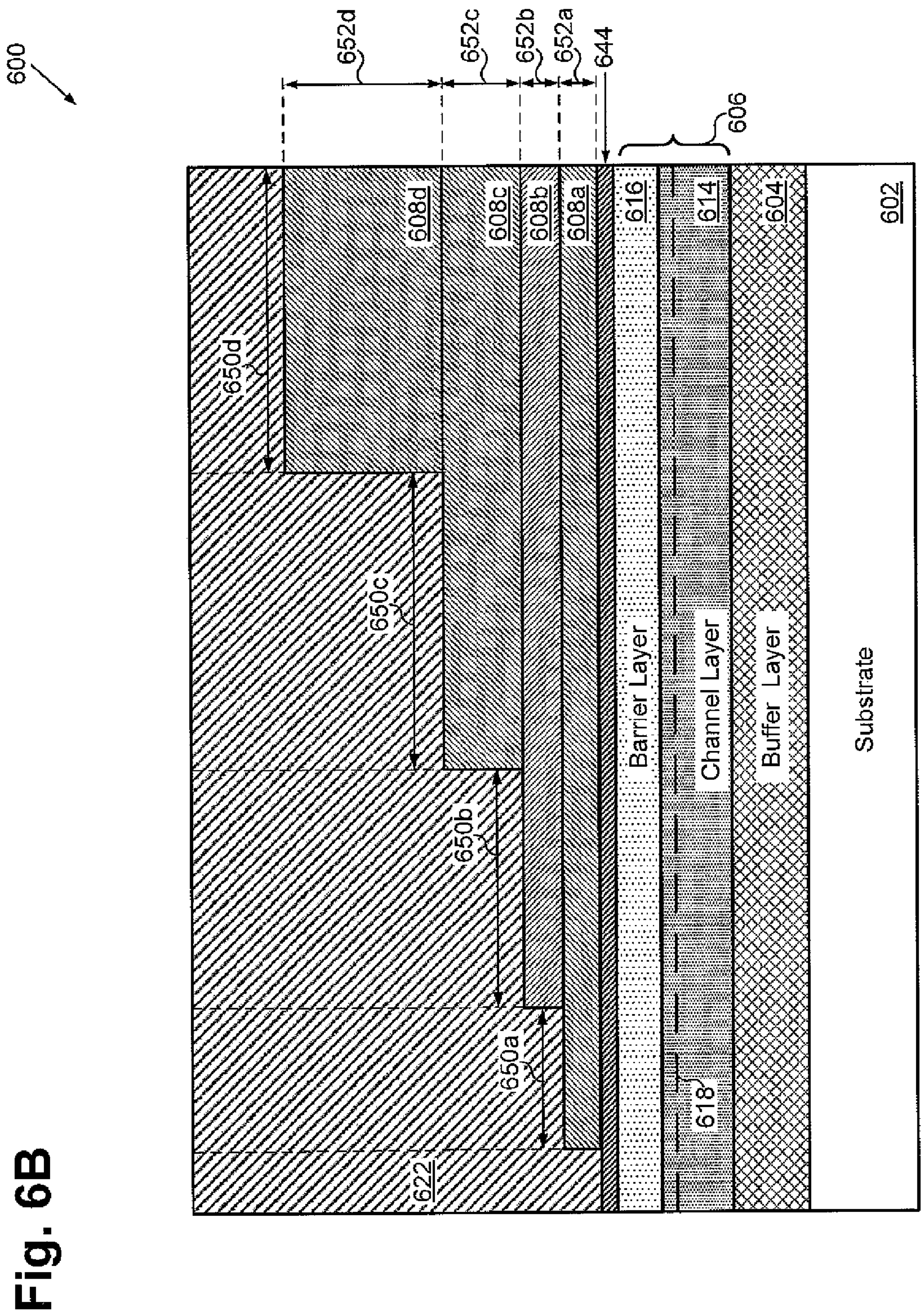
FIG. 6B presents an enhanced cross-sectional view of a portion of an exemplary III-nitride semiconductor device, in accordance with one implementation of the present disclosure.

In FIGS. 5A and 5B, source-side field plate 546 and drain-side field plate 548 are substantially symmetrical. However, in various implementations, any of the source-side and drain-side field plates described herein may be asymmetrical with respect to one another. This may be accomplished by configuring the widths of steps of a field plate, such as steps 548*a*, 548*b*, 548*c*, and 548*d* of drain-side field plate 548. FIGS. 6A and 6B illustrate one example of a III-nitride semiconductor device having asymmetrical source-side and drain-side field plates. FIG. 6A presents a cross-sectional view of a portion of an exemplary III-nitride semiconductor device, in accordance with one implementation of the present disclosure. FIG. 6B presents an enhanced cross-sectional view of the portion of an exemplary III-nitride semiconductor device, in accordance with one implementation of the present disclosure.

In FIGS. 6A and 6B, III-nitride semiconductor device 600 includes substrate 602, buffer layer 604, III-nitride heterojunction 606, dielectric body 608, gate arrangement 610, ohmic electrodes 612*a* and 612*b*, and gate well 620 corresponding respectively to substrate 502, buffer layer 504, III-nitride heterojunction 506, dielectric body 508, gate arrangement 510, ohmic electrodes 512*a* and 512*b*, and gate well 520 in FIGS. 5A and 5B.

III-nitride heterojunction 606 is formed over buffer layer 604 and includes III-nitride body 616 situated over III-nitride body 614 to form a two-dimensional electron gas (2DEG) 618. III-nitride bodies 614 and 616 and 2DEG 618 correspond respectively to III-nitride bodies 514 and 516 and 2DEG 518 in FIGS. 5A and 5B.

Dielectric body 608 includes dielectric layers 608*a*, 608*b*, 608*c*, and 608*d* corresponding respectively to dielectric layers 508*a*, 508*b*, 508*c*, and 508*d* in dielectric body 508. Dielectric body 608 also includes ledges 636*a*, 636*b*, 636*c*, and 636*d* corresponding respectively to ledges 536*a*, 536*b*, 536*c*, and 536*d* of dielectric body 508. Dielectric body 608 further includes ledges 638*a*, 638*b*, 638*c*, and 638*d* corresponding respectively to ledges 538*a*, 538*b*, 538*c*, and 538*d* of dielectric body 508. Dielectric body 608 can include at least one silicon nitride layer and at least one silicon oxide layer as dielectric layers. It should be noted that as with other implementations described herein, dielectric body 608 can include more or fewer dielectric layers than shown.

Gate arrangement 610 includes gate electrode 622 integrated with field plates 646 and 648 and corresponding respectively to gate electrode 522 and field plates 546 and 548 in FIGS. 5A and 5B. Thus, field plate 646 is a source-side field plate and field plate 648 is a drain-side source-side field plate. Gate arrangement 610 also includes gate dielectric 644 corresponding to gate dielectric 544 in FIGS. 5A and 5B. While gate dielectric 644 is situated below gate well 620, similar to gate dielectric 544 in FIGS. 5A and 5B, in other implementations, gate dielectric 644 can be situated in and line gate well 620, similar to gate dielectric 124 in FIGS. 1A and 1B.

In III-nitride semiconductor device 600, field plate 646 includes steps 646*a*, 646*b*, 646*c*, and 646*d* corresponding respectively to steps 546*a*, 546*b*, 546*c*, and 546*d* of field plate 546. Thus, at least some of steps 646*a*, 646*b*, 646*c*, and 646*d* of field plate 646 may be defined by ledges 636*a*, 636*b*, 636*c*, and 636*d* of dielectric body 608. Furthermore, at least one of steps 646*a*, 646*b*, 646*c*, and 646*d* of field plate 646 may be defined by openings in dielectric body 608. Field plate 648 includes steps 648*a*, 648*b*, 648*c*, and 648*d* corresponding respectively to steps 548*a*, 548*b*, 548*c*, and 548*d* of field plate 548. Thus, at least some of steps 648*a*, 648*b*, 648*c*, and 648*d* of field plate 648 may be defined by ledges 638*a*, 638*b*, 638*c*, and 638*d* of dielectric body 608. Furthermore, at least one of steps 648*a*, 648*b*, 648*c*, and 648*d* of field plate 648 may be defined by openings in dielectric body 608.

Thus, III-nitride semiconductor device 600 is similar to III-nitride semiconductor device 500. However, while in III-nitride semiconductor device 500, fields plates 546 and 548 are symmetrical, in III-nitride semiconductor device 600, field plates 646 and 648 are asymmetrical.

As shown in FIG. 6A, field plate 646 (e.g. a source-side field plate) and field plate 648 (e.g. a drain-side field plate) each include steps being of widths such that field plate 648 is wider than field plate 646. As such, the breakdown voltage of III-nitride semiconductor device 600 may be further improved.

In III-nitride semiconductor device 600, at least one of steps 648*a*, 648*b*, 648*c*, and 648*d* of field plate 648 is wider than at least one of steps 646*a*, 646*b*, 646*c*, and 646*d* of field plate 646. Doing so allows for enhanced active area shaping while providing field plate 648 with a greater width than field plate 646. In the implementation shown, each one of steps 648*a*, 648*b*, 648*c*, and 648*d* of field plate 648 is wider than a corresponding one of steps 646*a*, 646*b*, 646*c*, and 646*d* of field plate 646. For example, step 648*a* (i.e. a closest of the steps of field plate 648 to gate electrode 622) is wider than step 646*a*. However, some of steps 648*a*, 648*b*, 648*c*, and 648*d* of field plate 648 are not wider than the corresponding one of steps 646*a*, 646*b*, 646*c*, and 646*d* of field plate 646 in other implementations.

Also in some implementations, at least some of steps 648*a*, 648*b*, 648*c*, and 648*d* of field plate 648 have different widths with respect to one another. For example, FIG. 6B shows steps 648*a*, 648*b*, 648*c*, and 648*d* of field plate 648 having widths 650*a*, 650*b*, 650*c*, and 650*d*, which are different with respect to one another. Doing so allows for enhanced active area shaping of III-nitride semiconductor device 600. It should be noted that at least some steps of a source-side and/or a drain-side field can have different widths with respect to one another in any of the implementations described herein without being limited to FIGS. 6A and 6B. Furthermore, this concept may be applied to III-nitride semiconductor devices having only a source-side field plate or only a drain-side field plate.

In some implementations, in field plate 648, ones of steps 648*a*, 648*b*, 648*c*, and 648*d* closer to ohmic electrode 612*b* (e.g. a drain electrode) of III-nitride semiconductor device 600 are wider than ones of steps 648*a*, 648*b*, and 648*c* within gate well 620 that are closer to gate electrode 622. Similarly, in implementations having field plate 646, ones of steps 646*a*, 646*b*, 646*c*, and 646*d* closer to ohmic electrode 612*a* (e.g. a source electrode) of III-nitride semiconductor device 600 may be wider than ones of steps 646*a*, 646*b*, and 646*c* within gate well 620 that are closer to gate electrode 622. Also, in some implementations, in field plate 648, a closest one of steps 648*a*, 648*b*, 648*c*, and 648*d* to gate electrode 622 (i.e. step 648*a*) has a smallest width of steps 648*a*, 648*b*, and 648*c* within gate well 620. Similarly, in field plate 646, a closest one of steps 646*a*, 646*b*, 646*c*, and 646*d* to gate electrode 622 (i.e. step 646*a*) has a smallest width of steps 646*a*, 646*b*, and 646*c* within gate well 620. It will be appreciated that many other configurations are possible.

Also, for various implementations described herein that utilize a dielectric body having multiple dielectric layers, at least one of the dielectric layers can be of a different thickness than another of the dielectric layers. This can further enhance active area shaping for a III-nitride semiconductor device. For example, FIG. 6B shows dielectric layers 608*a*, 608*b*, 608*c*, and 608*d* of dielectric body 608 having thicknesses 652*a*, 652*b*, 652*c*, and 652*d* respectively. In some implementations, a thicker one of dielectric layers 608*a*, 608*b*, 608*c*, and 608*d* is situated over a thinner one of dielectric layers 608*a*, 608*b*, 608*c*, and 608*d*. The thinner one of dielectric layers 608*a*, 608*b*, 608*c*, and 608*d* may be a closest of dielectric layers 608*a*, 608*b*, 608*c*, and 608*d* to III-nitride heterojunction 606, as shown. Also, a relative thickness of dielectric layers 608*a*, 608*b*, 608*c*, and 608*d* may increase with a distance to III-nitride heterojunction 606, as shown. It will be appreciated that other configurations, are possible.

Thus, as described above with respect to FIGS. 1A, 1B, 2, 3A, 3B, 3C, 4, 5A, 5B, 6A, and 6B implementations of the present disclosure can utilize a dielectric body to allow for III-nitride semiconductor devices with decreased overlap between a gate electrode and 2DEG, thereby reducing Qgd. Furthermore, high electric fields that would otherwise form from sharp corners of the gate electrode can be alleviated, thereby increasing breakdown voltage of the III-nitride semiconductor device. A source-side field plate and a drain-side field plate each including steps can be provided in the III-nitride semiconductor devices. The steps can be of widths such that the drain-side field plate is wider than the source-side field plate so as to improve breakdown voltage of the III-nitride semiconductor devices.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A III-nitride semiconductor device comprising:
- a III-nitride heterojunction including a first III-nitride body situated over a second III-nitride body to form a two-dimensional electron gas;
- a gate well formed in a dielectric body, said dielectric body situated over said III-nitride heterojunction and including first, second, and third dielectric layers providing respective ledges situated within said gate well;
- first and second ohmic electrodes extending through said dielectric body to contact said III-nitride heterojunction;
- a single gate dielectric layer situated between said III-nitride heterojunction and said dielectric body, said single gate dielectric layer extending from said first ohmic electrode to said second ohmic electrode;
- a gate arrangement situated in said gate well and comprising a gate electrode, a source-side field plate, and a drain-side field plate;
- said source-side field plate and said drain-side field plate each comprising steps situated within said gate well and a step situated over said dielectric body, said steps situated within said well being defined by said respective ledges of said first, second, and third dielectric layers;
- said step of said drain-side field plate situated over said dielectric body being wider than said step of said source-side field plate situated over said dielectric body, and also being wider than said steps of said drain-side field plate situated within said gate well.

2. The III-nitride semiconductor device of claim 1, wherein at least one of said steps of said drain-side field plate situated within said well is wider than at least one of said steps of said source-side field plate situated within said well.

3. The III-nitride semiconductor device of claim 1, wherein one of said steps of said drain-side field plate situated within said well is wider than a corresponding one of said steps of said source-side field plate situated within said well.

4. The III-nitride semiconductor device of claim 1, wherein at least some of said steps of said drain-side field plate situated within said gate well have different widths from one another.

5. The III-nitride semiconductor device of claim 1, wherein a closest one of said steps to said gate electrode has a smallest width of said steps within said gate well.

6. The III-nitride semiconductor device of claim 1, wherein said drain-side field plate is situated over said first, second, and third dielectric layers of said dielectric body, at least one of said first, second, and third dielectric layers being of a different thickness than another of said first, second, and third dielectric layers.

7. The III-nitride semiconductor device of claim 1, wherein said steps are defined by openings in said dielectric body.

8. The III-nitride semiconductor device of claim 1, wherein said dielectric body comprises at least one silicon nitride layer and at least one silicon oxide layer.

9. The III-nitride semiconductor device of claim 1, wherein said source-side field plate and said drain-side field plate are integrated with said gate electrode.

10. A III-nitride semiconductor device comprising:
- a III-nitride heterojunction including a first III-nitride body situated over a second III-nitride body to form a two-dimensional electron gas;
- a gate well formed in a dielectric body, said dielectric body situated over said III-nitride heterojunction and including first, second, and third dielectric layers providing respective ledges situated within said gate well;
- first and second ohmic electrodes extending through said dielectric body to contact said III-nitride heterojunction;
- a single gate dielectric layer situated between and adjoining said III-nitride heterojunction and said dielectric body, said single gate dielectric layer extending from said first ohmic electrode to said second ohmic electrode;
- a gate arrangement situated in said gate well and comprising a gate electrode, a source-side field plate, and a drain-side field plate;
- said source-side field plate and said drain-side field plate each comprising steps situated within said gate well and a step situated over said dielectric body, said steps situated within said well being defined by said respective ledges of said first, second, and third dielectric layers, wherein said step of said drain-side field plate situated over said dielectric body is wider than said step of said source-side field plate situated over said dielectric body, and is also wider than said steps of said drain-side field plate situated within said gate well.

11. The III-nitride semiconductor device of claim 10, wherein a closest of said steps of said drain-side field plate to said gate electrode is wider than at least one of said steps of said source-side field plate.

12. The III-nitride semiconductor device of claim 10, wherein said drain-side field plate is wider than said source-side field plate.

13. The III-nitride semiconductor device of claim 10, wherein at least some of said steps of said drain-side field plate situated within said gate well have different widths from one another.

14. The III-nitride semiconductor device of claim 10, wherein a closest one of said steps to said gate electrode has a smallest width of said steps within said gate well.

15. The III-nitride semiconductor device of claim 10, wherein at Least one of said steps of said drain-side field plate and at least one of said steps of said source-side field plate are defined by openings in said dielectric body.

16. The III-nitride semiconductor device of claim 10, wherein said dielectric body comprises at least one silicon nitride layer and at least one silicon oxide layer.

* * * * *